US 6,427,157 B1

(12) United States Patent
Webb

(10) Patent No.: US 6,427,157 B1
(45) Date of Patent: Jul. 30, 2002

(54) FIR FILTER STRUCTURE WITH TIME- VARYING COEFFICIENTS AND FILTERING METHOD FOR DIGITAL DATA SCALING

(75) Inventor: Jennifer H. Webb, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/363,799

(22) Filed: Jul. 29, 1999

Related U.S. Application Data
(60) Provisional application No. 60/094,858, filed on Jul. 31, 1998.

(51) Int. Cl.[7] ............................ G06F 17/17; H03M 7/00
(52) U.S. Cl. .......................................... 708/313; 341/61
(58) Field of Search ................................. 708/300, 301, 708/303, 313, 316, 319; 341/61, 122, 123

(56) References Cited

U.S. PATENT DOCUMENTS

| 4,020,332 | A | | 4/1977 | Crochiere et al. | |
|---|---|---|---|---|---|
| 4,725,972 | A | | 2/1988 | Gockler | |
| 5,339,264 | A | * | 8/1994 | Said et al. | 708/319 |
| 5,410,616 | A | | 4/1995 | Kidd | |
| 5,594,675 | A | * | 1/1997 | Peng | 708/313 |
| 5,838,725 | A | * | 11/1998 | Gurusami et al. | 375/229 |
| 5,907,295 | A | * | 5/1999 | Lin | 341/61 |
| 6,057,789 | A | * | 5/2000 | Lin | 341/61 |

OTHER PUBLICATIONS

Interpolation and Decimation of Digital Signals—A Tutorial Review; Ronald E. Crochiere et al.; Proceedings of the IEEE, vol. 69, No. 3, Mar. 1981; pp. 300–326.

Decimation and Interpolation; J. G. Proakis et al.; Introduction to Digital Signal Processing; pp. 654–671, 1988.

* cited by examiner

Primary Examiner—Choung Dinh Ngo
(74) Attorney, Agent, or Firm—April M. Mosby; W. James Brady; Frederick J. Telecky, Jr.

(57) ABSTRACT

An improved design and method of a digital decimation and interpolation filter for a multi-bit input signal, reduces the buffer requirement during a decimation operation and relieves the processing bottleneck during an interpolation operation through the use of transposition of an FIR filter structure having time-varying coefficients. The design includes an input lead (120), a multiplier (122), a accumulator (132), a memory (128), a shift register (132), an output buffer (138) and a sequencer (140). The input lead receives the digital input signal. The multiplier (122) having a first and second multiplier input terminal coupled to the input lead (120) at its second multiplier terminal receives the digital input signal. The memory (128), having stored coefficient sets, is coupled to the first multiplier input terminal. The sequencer (140), coupled to the memory (128) and the output buffer (138), transfers each coefficient set to the first multiplier input terminal. The accumulator (132), coupled to the multiplier (122), determines partial sums of the output sample y(n) by summing the products supplied by multiplier (122). The accumulated product is stored in the shift register (136) and; thereafter, transferred to the buffer memory (138). The buffer memory (138), coupled to the accumulator, receives and stores the accumulated output sample y(n).

6 Claims, 5 Drawing Sheets

FIR FILTER STRUCTURE WITH TIME-VARYING COEFFICIENTS AND FILTERING METHOD FOR DIGITAL DATA SCALING

This application claims the benefit of provisional application 60/094,858 filed Jul. 31, 1998.

BACKGROUND OF THE INVENTION

1. Field of the Invention

This invention relates generally to digital signal filter processing (DSP) and, particularly, relates to an apparatus and method for implementing digital interpolation and decimation having an improved finite impulse response (FIR) filter structure with time-varying coefficients.

2. Description of the Related Art

Digital television, video telecommunication devices, and personal computers often require resizing of image data through sampling rate conversion. Sampling rate conversion by a fractional amount(U/D), may be construed as increasing the sampling frequency by an integer factor U (also known as interpolation) and subsequently decreasing the sampling frequency by an integer factor D (also known as decimation). Given two-dimensional data, interpolation and decimation requires buffering rows of data, in order to access vertically adjacent samples not stored in contiguous memory locations. Interpolation, useful for raster imaging, requires large amounts of computer memory to store data in compressed form and to enlarge this data for display due to the buffering of input data. Likewise, prior art digital resampling techniques using decimation often require large amounts of computer memory to store digital input samples.

Thus, buffering input data imposes a high cost and size penalty on manufacturers of low-end, compact devices with small displays. Conversely, not buffering the output imposes a high cost on performance speed in high-end, wide-screen displays, requiring optimum speed rather than lower buffering requirements.

Some prior art digital signal processors use FIR filter structures with time-varying coefficients to enlarge and reduce the received image. Proakis and Manolakis describe such digital resampling techniques in "Introduction to Digital Signal Processing," pages 654–671 (1988). These FIR structures, operating at the output rate, compute each output sample as a linear combination of each input sample. The weight of each input sample varies according to its proximity to the output sample. When an image is interpolated by a large factor, the digital signal processor requires a high processing clock rate to interface with the incoming data stream. As a result, there exists an increase in hardware and, thus, cost.

During sampling rate enlargement, the output rate is relatively high, increasing the probability of a processing bottleneck. During sampling rate reduction, the amount of memory required to buffer the input can be excessive, increasing the cost and size of the apparatus. Therefore, the FIR filter implementation is complex in design and expensive.

Crochiere et al. describe a prior art single-stage interpolator-decimator circuit in U.S. Pat. No. 4,020,332 entitled INTERPOLATION-DECIMATION CIRCUIT FOR INCREASING OR DECREASING DIGITAL SAMPLING FREQUENCY, which is hereby incorporated by reference. Although Crochiere et al. has demonstrated that single stage or multistage interpolation and decimation result in computational efficiency, this prior art has not provided an interpolation or decimation circuit that can be realized by a simple circuit structure.

There is therefore a need for a fast, cost effective, computationally efficient method and apparatus for reducing and enlarging images by a fractional amount. It is also desirable that the method produces output images of as good or better quality than those produced using other known scaling techniques. Finally, such methods should be easily and conveniently implemented in hardware.

SUMMARY OF THE INVENTION

An improved FIR filter structure has time-varying coefficients for converting the sampling rate of a digital input signal by a fractional amount that eliminates input signal sample buffering and, thereby, reduces hardware requirements during a decimation operation and relieves the processing bottleneck during an interpolation operation, increasing the speed of the device.

The filter design includes a multiplier, a memory, a sequencer, an accumulator, and an output buffer. The multiplier having first and second input terminals for supplying an output signal that is the product of the signals applied to the first and second input terminal is coupled to the memory that stores L sets of coefficients $g_i(n)$. The sequencer for sequentially transferring each coefficient set $g_i(n)$ to the first multiplier input terminal and the input signal to the second multiplier input terminal is coupled to the multiplier and the memory. The accumulator for determining the output sample $y(n)$ by summing the products supplied by multiplier over the range $j=0$ to $j=N-1$ is coupled to the sequencer. The output buffer is coupled to the accumulator for storing the accumulated output sample $y(n)$.

The proposed structure, as shown in FIG. 3, operates at the input data rate and requires buffering of the output data. The filtering apparatus distributes the multi-bit digital input signal among the affected output samples, multiplying each input sample by the associated coefficients. The multiplier output is accumulated, forming partial sums to derive an associated output sample, rather than computing a weighted sum at the output data rate for each output sample as in the conventional FIR filtering scheme. Thus, buffering the output significantly reduces hardware and memory requirements during a decimation operation. Likewise, during interpolation of an image for a given multiplier speed, the speed of the apparatus increases, in light of a marginal increase in hardware requirement. FIG. 5 is a physical implementation of FIG. 3.

BRIEF DESCRIPTION OF THE DRAWINGS

The features and advantages of the improved FIR structure with time-varying coefficients filtering according to the present invention will be more clearly understood from the following description taken in conjunction with the accompanying drawings in which.

DETAILED DESCRIPTION OF THE INVENTION

An image resampling apparatus and method of the invention is based upon an improved implementation of a known technique for sampling rate conversion by an arbitrary rational factor. (i.e. U/D, U and D being integers). The conventional approach employs interpolation followed by decimation. More particularly, upsampling by inserting zero-valued samples followed by decimation. Conventional systems employ FIR filters with time-varying coefficients, to avoid unnecessary multiplication by the inserted zero values and to avoid computation of output samples that are eliminated through downsampling. In the novel implementation disclosed here, the apparatus is transposed, eliminating input signal sample buffering and, thereby, reducing conventional hardware requirements for downscaling. This novel implementation reduces the buffer requirement during a decimation operation and relieves the processing bottleneck during an interpolation operation, increasing the speed of the device.

Figure 1:
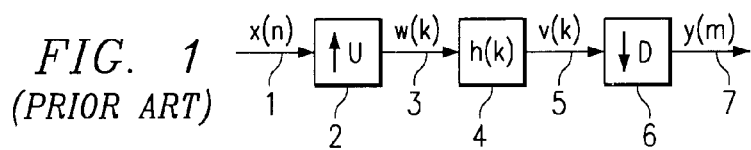
FIG. 1 is a functional block diagram of a conventional rational factor, sampling rate conversion system.

FIG. 1 shows a general block diagram of a conventional rational factor, sampling rate conversion system. Such a system is described in "Interpolation and Decimation of Digital Signals—A Tutorial Review," Crochiere and Rabiner, Proceedings of the IEEE, March 1981, pp. 300–331. As seen from FIG. 1, the input signal x(n) appearing at input 1 is coupled to a sampling rate expander 2 that up-samples the input signal by a factor of U. The output of sampling rate expander 2 is coupled via lead 3 and carries an up-sampled signal designated w(k) that is input to a low pass finite impulse response filter 4 having an impulse response h(k). The output of the filter 4 is a filtered signal v(k) on lead 5 that is input to a sampling rate compressor 6 that down-samples the signal v(k) by a factor of D to produce at output 7 the scaled signal y(m).

The input signal, x(n) with discrete Fourier transform $X(e^{j\omega})$, is up-sampled by a factor of U by inserting U−1 zeros between each pair of values of x(n). The resulting up-sampled signal w(k), is related to x(n) by $$w(k) = \begin{cases} x\left(\frac{k}{U}\right) & \text{for } k = 0, \pm U, \pm 2U, \ldots \\ 0, & \text{otherwise} \end{cases}$$

$W(e^{j\omega})$ contains the original baseband information of $X(e^{j\omega})$ along with "images" of the baseband information at integer multiples of plus or minus $2\pi/U$.

The up-sampled signal w(k) is then passed through a low pass filter with impulse response h(k) and frequency response $H(e^{j\omega})$ The purpose of this filter is to interpolate the zero samples of w(k) removing the "image" spectra and to band limit (according to the Nyquist criterion) prior to decimation by a factor of D. To give the theoretically correct output signal y(m) that is free of aliasing and pass-band attenuation the filter should have a frequency response given by $$H(e^{j\omega}) = \begin{cases} U, & |\omega| \leq \min\left[\frac{\pi}{U}, \frac{\pi}{D}\right] \\ 0, & \text{otherwise} \end{cases}$$

Since such a filter is not physically realizable, various compromises are made that generally introduce both pass band attenuation and aliasing. Finally, the interpolated signal is sub-sampled by a factor of D. That is $$y(m) = v(Dm)$$

In particular, for the implementation of this invention, the filter is required to be implemented with finite impulse response structures with time-varying coefficients.

$V(e^{j\omega})$, the discrete Fourier transform of the filtered signal v(k), is related to the input signal by $$V(e^{j\omega}) = X(e^{jU\omega})H(e^{j\omega})$$

where $$v(k) = \sum_{r=-\infty}^{\infty} h(k - rU)x(r).$$

Introducing a change of variables, let $$r = \left\lfloor \frac{m}{U} \right\rfloor - n$$

The identity $$mD - \left\lfloor \frac{mD}{U} \right\rfloor U = (mD) \oplus U$$

exists where $\lfloor u \rfloor$ denotes the closest integer less than or equal to u and $(i) \oplus U$ denotes the value of i modulo U. Thus, $$y(m) = \sum_{n=-\infty}^{\infty} h\left(Dm - \left\lfloor \frac{mD}{U} \right\rfloor U + nU\right) \times \left(\left\lfloor \frac{mD}{U} \right\rfloor - n\right)$$

$$= \sum_{n=-\infty}^{\infty} h(nU + mD \oplus U) \times \left(\left\lfloor \frac{mD}{U} \right\rfloor - n\right)$$

It is seen that this equation corresponds to the general form of the time-varying digital-to-digital conversion system described by $$y(m) = \sum_{n=-\infty}^{\infty} g_m(n) \times \left(\left\lfloor \frac{mD}{U} \right\rfloor - n\right)$$

and that the time-varying unit sample response $g_m(n)$ can be expressed as $$g_m(n) = h(nU + mD \oplus U), \text{ for all } m \text{ and all } n$$

It will be convenient for our discussion to assume that the length of the filter h(k) is a multiple of U, i.e., $$N = QU$$

where Q is an integer. Then all of the coefficient sets $g_m(n)$, m=0, 1, 2, ..., U−1 contain exactly Q coefficients. Furthermore $g_m(n)$ is periodic in m with period U, i.e., $$gm(n)=g_{m+ru}(n), r=0, \pm 1, \pm 2, \ldots$$

Therefore, y(m) can be expressed as $$y(m) = \sum_{n=0}^{Q-1} g_{m \oplus U}(n) \times \left( \left\lfloor \frac{mD}{U} \right\rfloor - n \right)$$

This equation shows that the computation of an output sample y(m) is obtained as a weighted sum of Q sequential samples of x(n) starting at the $$x\left(\left\lfloor \frac{mD}{U} \right\rfloor\right)$$

sample and going backwards in n sequentially. The weighting coefficients are periodically time varying so that the m⊕U coefficient set $g_{m \oplus U}(n)$, n=0, 1, 2, ..., Q−1, is used for the mth output sample.

Figure 2:
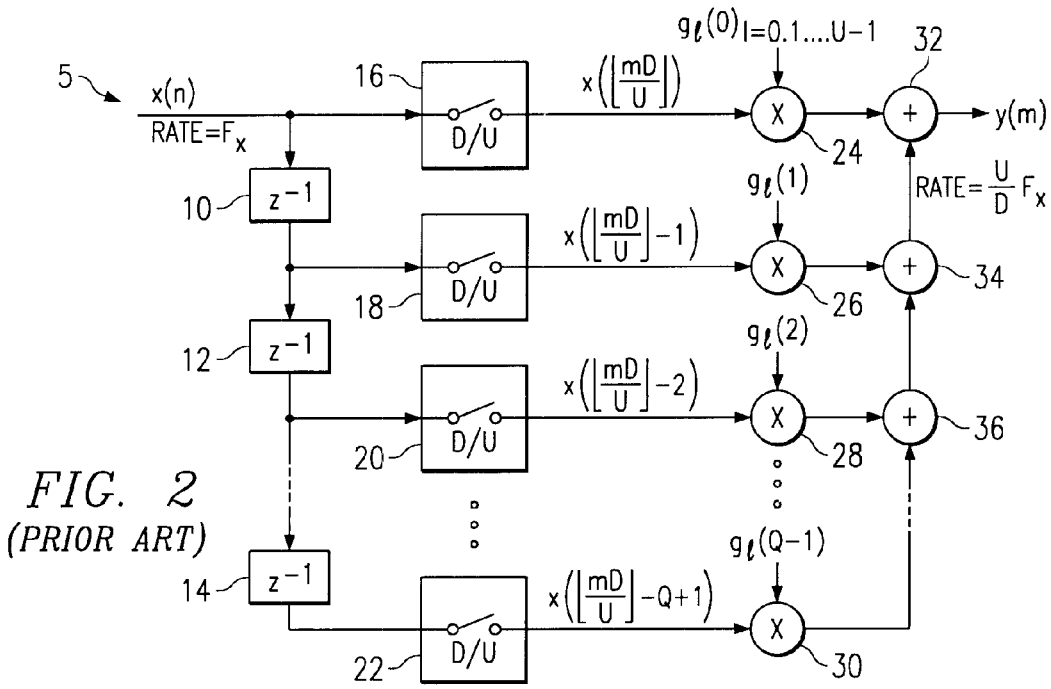
FIG. 2 is a block diagram of a prior art digital signal device having FIR structure with time-varying coefficient filtering.

FIG. 2 depicts the conventional FIR filter structure 5 having periodically varying filter coefficients for changing the sampling rate of an applied signal by the factor U/D. Proakis and Manolakis in "Introduction to Digital Signal Processing," pages 662–671, 1988, have shown that decimation and interpolation can be efficiently implemented using FIR filters. The FIR filter structure includes a shift register having a plurality of stages 10, 12, and 14, a plurality of sample-and-hold devices 16, 18, 20 and 22, a plurality of coefficients $g_j(k)$, where k=0, 1, ... Q−1 and j=0, 1, ... U−1, a plurality of multipliers 24, 26, 28, and 30, and a plurality of accumulators 32, 34, and 36. The plurality of stages 10, 12, and 14 is coupled to the associated one of the plurality of sample-and-hold devices 16, 18, 20 and 22. The plurality of multipliers 24, 26, 28, and 30 is coupled to the associated coefficients $g_j(k)$ and the plurality of sample-and-hold devices 16, 18, 20 and 22. The plurality of accumulators 32, 34, and 36 is coupled to the plurality of multipliers 24, 26, 28, and 30.

The input samples x(n) are passed into a shift register that operates at the sampling rate $F_x$ and is of length Q=N/U, where N is the length of the time-invariant FIR filter, specified by the frequency response given by $$H(\omega_v) = \begin{cases} U & 0 \le |\omega| \le \min(\pi/D, \pi/U) \\ 0 & \text{otherwise} \end{cases}$$

Each stage 10, 12, and 14 of the register is coupled to an associated one of the plurality of sample-and-hold devices 16, 18, 20 and 22 that converts the input sample rate $F_x$, to the output sample rate $F_y=(U/D)F_x$.

The sample at the input to each one of the plurality of sample-and-hold devices 16, 18, 20 and 22 is held until the next input sample arrives and then discarded. The output samples of the plurality of sample-and-hold devices 16, 18, 20 and 22 are taken at times mD/U, m=0,1,2, ... When both the input and output sampling times coincide (i.e., when mD/U is an integer), the input to the associated one of the plurality of sample-and-hold devices 16, 18, 20 and 22 is changed first and then the output samples the new input. The Q outputs from the Q sample-and-hold devices 16, 18, 20 and 22 are multiplied by the periodically time-varying coefficients $$gj(n) \text{ for } n=0, 1, 2, \ldots, Q-1 \text{ and } j=0,1, \ldots U-1$$

and the resulting products are summed to yield y(m). The computations at the output of the sample-and-hold devices are repeated at the output sampling rate of $F_y=U/DF_x$.

Figure 3:
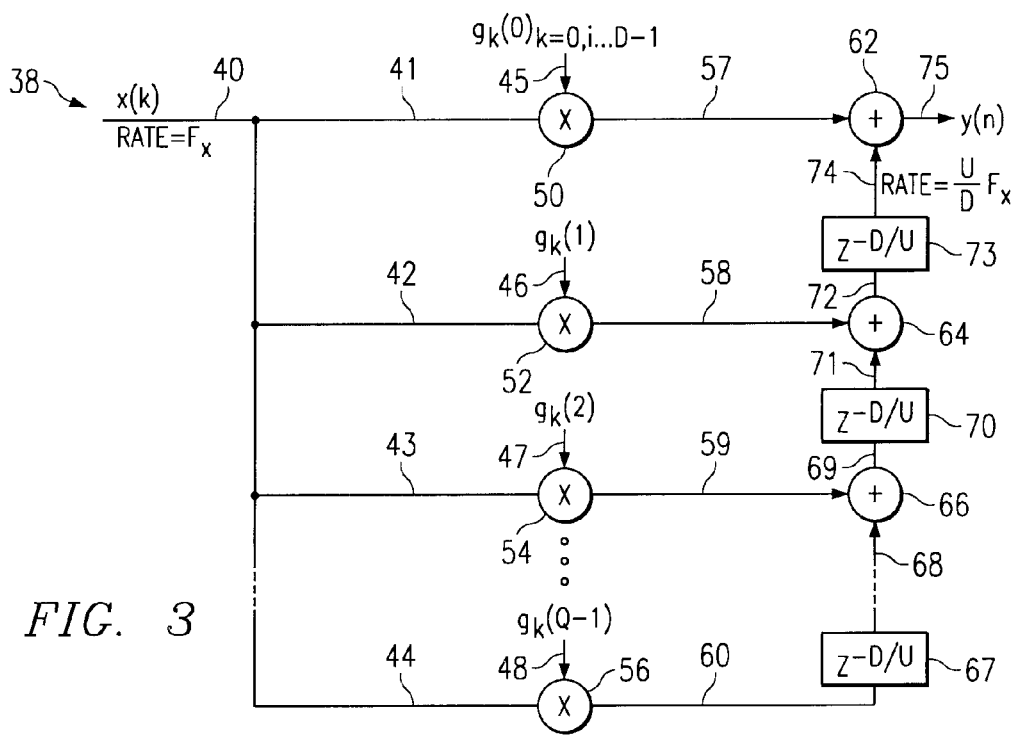
FIG. 3 is a block diagram of an digital signal device having FIR structure with time-varying coefficient filtering in accordance with this invention.

FIG. 3 illustrates an embodiment of a FIR filter structure 38 with periodically varying filter coefficients in accordance with the invention. The FIR filter structure includes an input terminal 40. The input terminal is connected to the input leads 41, 42, 43 and 44. A plurality of coefficients $g_k(n)$, where n=0,1, ... Q−1 and k=0,1, ... D−1, are coupled to a plurality of leads 45, 46, 47, and 48. The input leads 41, 42, 43 and 44 and plurality of leads 45, 46, 47, and 48 are coupled to a plurality of multipliers 50, 52, 54, and 56, having a plurality of output leads 57, 58, 59 and 60, respectively. The output lead 60 is coupled to first stage 67 of a shift register having a plurality of stages 67, 70, and 73 operating at the output rate of $U/DF_x$. The plurality of output leads 57, 58, and 59 are coupled to a plurality of accumulators 62, 64, and 66. The output terminal 68 of stage 67 is coupled to the accumulator 66 having an output lead 69. The output lead 69 is coupled to the stage 70 having an output lead 71. The output lead 71 is coupled to accumulator 64 having an output lead 72. The output lead 72 is coupled to stage 73 of the shift register having an output lead 74. The output lead 74 is coupled to accumulator 62 having an output lead 75, for supplying the resultant signal y(n).

The input signal x(k) is multiplied by the periodically time-varying coefficients g(L−1, k). The plurality of associated accumulators 62, 64 and 66 receive the resulting products. The plurality of multipliers and accumulator operate at the input rate $F_x$. The shift register of a plurality of stages 67, 70 and 73 has a time delay of D/U and operates at the sampling rate $U/DF_x$. When both the input and output sampling times coincide, (i.e. when mD/U is an integer) the multiply and accumulate occur first and then the results are shifted. Otherwise, the result of the addition is stored back in the same shift register stage without shifting. The resulting products are shifted and stored at the sampling rate $U/DF_x$. Note that for U>D, consecutive shifts may occur without an addition occurring in between. For D>U, multiple additions may occur between consecutive shifts. Accumulator 62 sums the shifted products and the resulting products to yield y(n).

The novel implementation results in a transformed filter structure with time-varying coefficients. As described by prior art, the filtered signal v(k) before downsampling is related to the input signal by $$v(k) = \sum_{r=-\infty}^{\infty} h(k - rU)x(r).$$

The novel approach uses the substitution $$k = \lceil rU/D \rceil + n.$$

The identity $$-rU + \lceil rU/D \rceil D = (-rU) \oplus D$$

exists, where ⌈n⌉ denotes the closest integer greater than or equal to n, and (n)⊕D denotes the value of n modulo D.

Thus, for the downsampled output, y(k)=v(Dk), $$y(\lceil rU/D \rceil + n) \Leftarrow \sum_{r=-\infty}^{\infty} h(nD + (-rU) \oplus D)x(r);$$

$$n = 0, 1, \quad (\lceil N/D \rceil - 1)$$

where ⇐ denotes that terms on the right contribute to partial sums of the output sample to the left, depending on the index variable r. For the invention, define $$g_r(n) = h(nD + (-rU) \oplus D) \text{ for all } r \text{ and } n=0, 1, \ldots (\lceil N/D \rceil - 1).$$

It will be convenient for our discussion to assume that the length of the filter h(k) is a multiple of D, i.e., $$N = QD$$

where Q is an integer. Then all of the coefficient sets $g_r(n)$ contain exactly Q coefficients. Furthermore, $g_r(n)$ is periodic in r with period D, i.e., $$g_r(n) = g_{(r+mD)}(n), m=0, \pm 1, \pm 2, \ldots$$

Therefore, y ($\lceil rU/D \rceil + n$) can be expressed as $$y(\lceil rU/D \rceil + n) \Leftarrow \sum_{r=-\infty}^{\infty} g_{r \oplus D}(n)x(r) \quad n = 0, 1, \ldots, (Q-1)$$

This expression shows that each input sample x(r) contributes to the computation of Q output samples. Multiple output samples may be computed in parallel as each input sample is processed.

Figure 4:
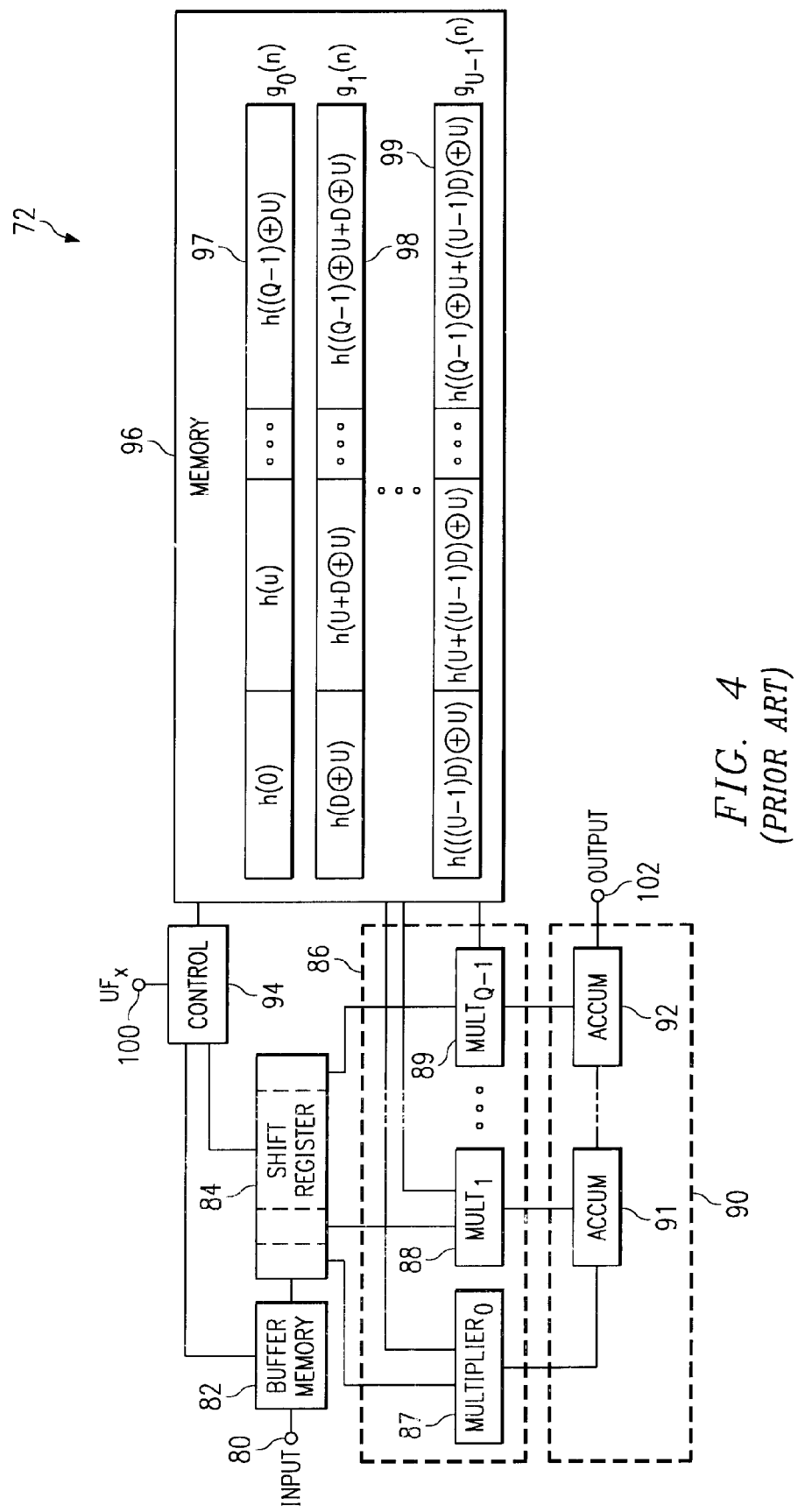
FIG. 4 is an embodiment of a prior art single-stage interpolator-decimator circuit.

FIG. 4 depicts an embodiment of a prior art single-stage interpolator-decimator circuit described in U.S. Pat. No. 4,020,332 entitled INTERPOLATION-DECIMATION CIRCUIT FOR INCREASING OR DECREASING DIGITAL SAMPLING FREQUENCY. This circuit 72 includes an input 80, a buffer memory 82, a memory 96, a shift register 84, a control 94, a multiplier 86, an accumulator 90, and an output 102. Input 80 is coupled to buffer memory 82. Buffer memory 82 is coupled to control 94 and shift register 84. Shift register 84 is coupled to multiplier 86. Multiplier 86 having a plurality of multiplier blocks 87, 88 and 89 is coupled to accumulator 90 having a plurality of accumulator blocks 91 and 92. Additionally, multiplier 86 is coupled to memory 96 having a plurality of coefficient blocks 97, 98, and 99.

The operation of the circuit 72 can be best understood by assuming that a particular output sample y(n−1) has just been determined and the circuit 72 is starting the sequence to determine the output sample y(n). At the beginning of such a sequence, signal samples that arrived during the calculation of y(n−1) are contained in buffer memory 82, which may be any conventional memory circuit of suitable capacity.

At the beginning of any given sequence, control 94 includes the number of input samples that are contained in buffer memory 82 and must be loaded into shift register 84 for each calculation sequence. In addition, control 94 determines when to connect the input of shift register 84 to buffer memory 82. The control 94 initiates the calculation sequence by transferring the data stored in buffer memory 82 into shift register 84. The control 94 signals the buffer memory 82 to transfer data samples to shift register 84. For instance if the buffer memory 82 contains two-dimensional image samples, the control 94 may signal the buffer memory 82 to transfer noncontiguous data samples corresponding to a vertical column of pixel values.

The control 94 points to the storage location of the proper coefficient block 97, 98 and 99 at the conclusion of a calculation sequence. Regardless of which output sample is being calculated, shift register 84 contains the proper input samples in an ordered sequence. During the calculation of each output sample y(n), control 94 sequentially shifts each input sample and each associated coefficient block 97, 98 and 99 to each associated multiplier block 87, 88 and 89.

The clock pulse of control 94 is divided by U to control shift register 84 at rate $F_x$. The clock pulse of control 94 is divided by D to control multiplication by coefficients at rate $F_y = UF_x/D$. After the clock pulse of control 94 triggers the multiplication operation, the calculation of the output samples will be complete and the value of the output sample will be available in accumulator 90.

Figure 5:
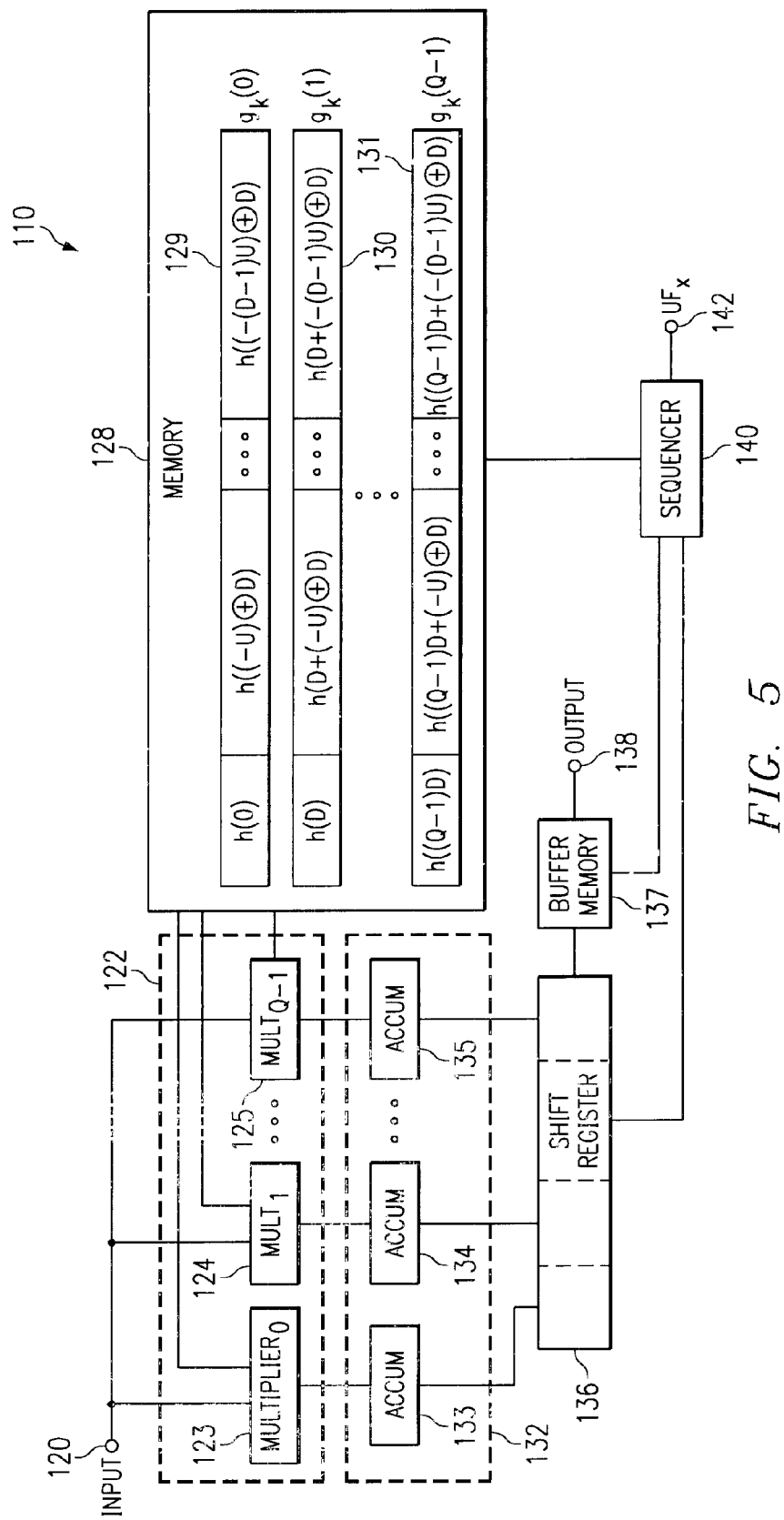
FIG. 5 is an embodiment of a single-stage interpolator-decimator circuit, a physical implementation of FIG. 3.

FIG. 5 depicts a physical implementation of FIG. 3. The circuit 110 includes an input lead 120, a memory 144, a buffer memory 138, a shift register 134, a sequencer 140, a multiplier 122, a accumulator 128, and an output 142. Input lead 120 is coupled to multiplier 122 having a plurality of multiplier blocks 123, 124 and 125. Memory 128 having a plurality of time-varying coefficient blocks 129, 130 and 131 is coupled to multiplier 122. Multiplier 122 is coupled to accumulator 132 having a plurality of accumulator blocks 133, 134 and 135. Multiplier blocks 123, 124 and 125 are coupled to associated accumulator blocks 133, 134 and 135. Accumulator 132 is coupled to shift register 136. Shift register 136 is coupled to buffer memory 137. Shift register 136, memory 128 and buffer memory 137 are coupled to sequencer 140 having an input terminal 142. Buffer memory 137 is coupled to output 138.

The operation of the circuit 110 can be best understood by assuming that a particular input sample x(n−1) has just been processed and the circuit 110 is starting the sequence to process the input sample x(n). The shift register 136 contains partial sums for a plurality of output samples. At the beginning of such a sequence, multiplier 122 receives the input signal. During the processing of each input sample x(n), control 140 shifts each coefficient from coefficient blocks 129, 130, and 131 to each associated multiplier block 123, 124, and 125. Associated accumulator blocks 133, 134 and 135 receive each associated product where the samples are added. Shift register 136 receives the updated partial sums.

At the beginning of any given sequence, sequencer 140 includes data defining the capacity of buffer memory 137. In addition, sequencer 140 determines when to connect shift register 136 to buffer memory 137. The sequencer 140 signals the shift register to transfer data samples to buffer memory 137 when all terms of a partial sum have been accumulated to determine an output sample. If the buffer memory 137 contains two-dimensional image output samples, the sequencer may transfer data from the shift register 136 to noncontiguous buffer memory, corresponding to a vertical column of pixel values.

The sequencer 140 points to the storage location of the proper coefficient blocks 129, 130, and 131 at the conclusion of a calculation sequence. The clock pulse of sequencer 140 is divided by U to control multiplication of coefficients at rate $F_x$. The clock pulse of sequencer 140 is divided by D to control shift register 136 at rate $F_y = UF_x/D$. When the clock pulse of sequencer 140 triggers the shift register, the calculation of an output sample will be complete and the value of the output sample will be stored in buffer memory 136.

The operation of the decimating/interpolating filter 110 may be more clearly seen by reference to two examples, a five to six interpolation and a four to three decimation. In five to six upscaling, U=6, D=5, and h(k)={h0, h1, h2, ..., hN}. Suppose N=15. Then Q=N/D=3, and $g_0(n)$={h0, h5, h10}

$g_1(n)$={h4, h9, h14}

$g_2(n)$={h3, h8, h13}

$g_3(n)$={h2, h7, h12}

$g_4(n)$={h1, h6, h11}

Multiplier 122 includes Q multiply units, accumulator 132 includes Q accumulate units, and shift register 136 includes Q stages. Let $x_t$ denote the input 120 at time t, in units of the control clock $1/(U F_x)$. Similarly, let $s_t(n)$ denote the nth stage of the shift register at time t. For off-line processing, only the sequence of operations is relevant, as the time is irrelevant. Stage $s_t(0)$ is coupled to the buffer memory 137. When a shift occurs, $$s_t(n) \leftarrow s_t(n+1) \quad \text{for } n = 0, 1, \ldots, Q-2$$

$$s_t(Q-1) = 0.$$

The sequence of operation is shown below in the various states of its operation.

---

State 0:
Start-up   $S_0(0)=S_0(1)=S_0(2)=0$.
           $t0 \leftarrow t=0$.
Update
           $S_t(n) = S_t(n) + x_t \cdot g_0(n)$    n=0, 1, ..., Q-1
Shift
           buffer memory 137 input = $s_t(0) = x_t \cdot g_0(0)$
              not valid at start-up
           $s_t(0) = s_t(1) \equiv x_t \cdot g_0(1)$
           $s_t(1) = s_t(2) \equiv x_t \cdot g_0(2)$
           $s_t(2) = 0$
State 1: t=t0+5    (D=5)
   Shift
           buffer memory 137 input=$s_{t0}(0) \equiv x_{t0-6} \cdot g_4(2) + x_{t0} \cdot g_0(1)$
              not valid at t=5
           $s_t(0) = s_{t0}(1) \equiv x_t \cdot g_0(2)$
           $s_t(1) = s_{t0}(2) \equiv 0$
           $s_t(2) = 0$
State 2:  t=t+6    (U=6)
   update
           $s_t(n) = s_{t0+5}(n) + x_t \cdot g_1(n)$    n=0, 1, ..., Q-1 =>
              $s_t(0) \equiv x_{t0} \cdot g_0(2) + x_t \cdot g_1(0)$
              $s_t(1) \equiv x_t \cdot g_1(1)$
              $s_t(2) \equiv x_t \cdot g_1(2)$
state 3:  t=t0+10
   shift
           buffer memory 137 input=$s_{t0+6}(0) \equiv x_{t0} \cdot g_0(2) + x_{t0+6} \cdot g_1(0)$
              $s_t(0) = s_{t0+6}(1)$
              $s_t(1) = s_{t0+6}(2)$
              $s_t(2) = 0$
state 4:  t=t0+12
   update
           $s_t(n) = s_{t0+10}(n) + x_t \cdot g_2(n)$    n=0, 1, ..., Q-1
              => $s_t(0) \equiv x_{t0+6} \cdot g_1(1) + x_t \cdot g_2(0)$
              $s_t(1) \equiv x_{t0+6} \cdot g_1(2) + x_t \cdot g_2(1)$
              $s_t(2) \equiv x_t \cdot g_2(2)$
state 5:  t=t0+15
   shift
       buffer memory 137 input=$s_{t0+12}(0) \equiv x_{t0+6} \cdot g_1(1) + x_{t0+12} g_2(0)$
              $s_t(0) = s_{t0+12}(1)$
              $s_t(1) = s_{t0+12}(2)$
              $s_t(2) = 0$
state 6:  t=t0+18
   update
           $s_t(n) = s_{t0+15}(n) + x_t \cdot g_3(n)$    n=0, 1, ..., Q-1
              => $s_t(0) \equiv x_{t0+6} \cdot g_1 + x_{t0+12} \cdot g_2(1) + x_t \cdot g_3(0)$
              $s_t(1) \equiv x_{t0+12} \cdot g_2(2) + x_t \cdot g_3(1)$
              $s_t(2) \equiv x_t \cdot g_3(2)$ -continued state 7:  t=t0+20
   shift
           buffer memory 137 input=$s_{t0+18}(0) \equiv x_{t0+6} \cdot g_1(2) + x_{t0+12} \cdot g_2(1) + x_{t0+18} \cdot g_3(0)$
              $s_t(0) = s_{t0+16}(1)$
              $s_t(1) = s_{t0+18}(2)$
              $s_t(2) = 0$
state 8:  t=t0+24
   update
           $S_t(n) = s_{t0+20}(n) + x_t \cdot g_4(n)$    n=0, ..., 1, ..., Q-1
              => $s_t(0) \equiv x_{t0+12} \cdot g_2(2) + x_{t0+18} \cdot g_3(1) + x_t \cdot g_4(0)$
              $s_t(1) \equiv x_{t0+18} \cdot g_3(2) + x_t \cdot g_4(1)$
              $s_t(2) \equiv x_t \cdot g_4(2)$
state 9:  t=t0+25
   shift
           buffer memory 137 input = $s_{t0+24}(0) \equiv x_{t0+12} \cdot g_2(2) + x_{t0+18} \cdot g_3(1) + x_{t0+24} \cdot g_4(0)$
              $s_t(0) = s_{t0+24}(1)$
              $s_t(1) = s_{t0+24}(2)$
              $s_t(2) = 0$
state 10: t=t0+30
   update
           $S_t(n) = s_{t0+25}(n) + x_t \cdot g_0(n)$    n=0, 1, ..., Q-1
              => $s_t(0) \equiv x_{t0+18} \cdot g_3(2) + x_{t0+24} \cdot g_4(1) + x_t \cdot g_0(0)$
              $s_t(1) \equiv x_{t0+24} \cdot g_4(2) + x_t \cdot g_0(1)$
              $s_t(2) \equiv x_t \cdot g_0(2)$
   shift
           buffer memory 137 input = $s_{t0+30}(0) \equiv x_{t0+18} \cdot g_3(2) + x_{t0+24} \cdot g_4(1) + x_{t0+30} \cdot g_0(0)$
              $s_t(0) = s_{t0+30}(1)$
              $s_t(1) = s_{t0+30}(2)$
              $s_t(2) = 0$
   $t0 \leftarrow t$
   go to state 1

---

In four to three downscaling, U=3, D=4, and h(k)={h0, h1, h2, ..., hN}. Suppose N=8. Then Q=N/D=2, and $g_0(n)$={h0, h4}

$g_1(n)$={h1, h5}

$g_2(n)$={h2, h6}

$g_3(n)$={h3, h7}

Multiplier 122 includes Q multiply units, accumulator 132 includes Q accumulate units, and shift register 136 includes Q stages. Let $x_t$ denote the input 120 at time t, in units of the control clock $1/(U F_x)$. Similarly, let $s_t(n)$ denote the nth stage of the shift register at time t. For off-line processing, only the sequence of operations is relevant, as the time is irrelevant. Stage $s_t(0)$ is coupled to the buffer memory 137. When a shift occurs, $$s_t(n) \leftarrow s_t(n+1) \quad \text{for } n = 0, 1, \ldots, Q-2$$

$$s_t(Q-1) = 0.$$

The sequence of operation is shown below in the various states of its operation.

---

State 0: start-up.
   $s_0(0)=s_0(1))=0$.
   $t0 \leftarrow t=0$.
   Update
           $s_t(n) = s_t(n) + x_t \cdot g_0(n)$    n=0, 1, ..., Q-1
   shift
           buffer memory 137 input = $s_t(0) = x_t \cdot g_0(0)$
              not valid at start-up
           $s_t(0) = s_t(1) \equiv x_t \cdot g_0(1)$
           $s_t(1) = 0$ -continued

```
State 1: t=t0+3     (U=3)
    update
            s_t(n) = s_t0(n) + x_t·g_1(n)   n=0, 1, ..., Q-1 =>
                s_t(0) ≡ x_t0-3·g_3(1) + x_t0·g_0(1) + x_t·g_1(0)
                s_t(1) ≡ x_t ·g_1(1)
State 2: t=t0+4     (D=4)
    shift
            buffer memory 137 input s_t0+3(0) ≡ x_t0-3·g_3(1)
                        +x_t0·g_0(1) + x_t0+3·g_1(0)  ;not valid at t=4
                s_t(0) = s_t0+3(1) ≡ x_t0+3 · g_1(1)
                s_t(1) = 0
state 3: t=t0+6
    update
            s_t(n) = s_t0+4(n) + x_t·g_2(n)    n=0, 1, ..., Q-1
                => s_t(0) ≡ x_t0+3·g_1(1) + x_t ·g_2(0)
                   s_t(1) ≡ x_t ·g_2(1)
state 4: t=t0+8
    shift
            buffer memory 137 input = s_t0+6(0) ≡ x_t0+3 ·g_1(1) +
                                         x_t0+6 · g_2(0)
                s_t(0) = s_t0+6(1) ≡ x_t0+6 · g_2(1)
                s_t(1) = 0
state 5: t=t0+9
    update
            s_t(n) = s_t0+8(n) + x_t·g_3(n)    n=0, 1, ..., Q-1
                => s_t(0) ≡ x_t0+6 ·g_2(1) + x_t ·g_3(0)
                   s_t(1) ≡ x_t ·g_3(1)
state 6: t=t0+12
    update
            s_t(n) = s_t0+9(n) + x_t·g_0(n)    n=0, 1, ..., Q-1
                => s_t(0)≡x_t0+6·g_2(1) +x_t0+9·g_3(0) +x_t·g_0(0)
                   s_t(1)≡x_t0+9·g_3(1) +x_t ·g_0(1)
    shift
            buffer memory 137 input=s_t0+12(0) ≡ x_t0+6·g_2(1) +
                                     x_t0+9·g_3(0) +x_t0+12·g_0(0)
                s_t(0) = s_t0+12(1) ≡ x_t0+9·g_3(1) +x_t0+12 ·g_0(1)
                s_t(1) = 0
    t0 ← t
    go to state 1
```

Figure 6:
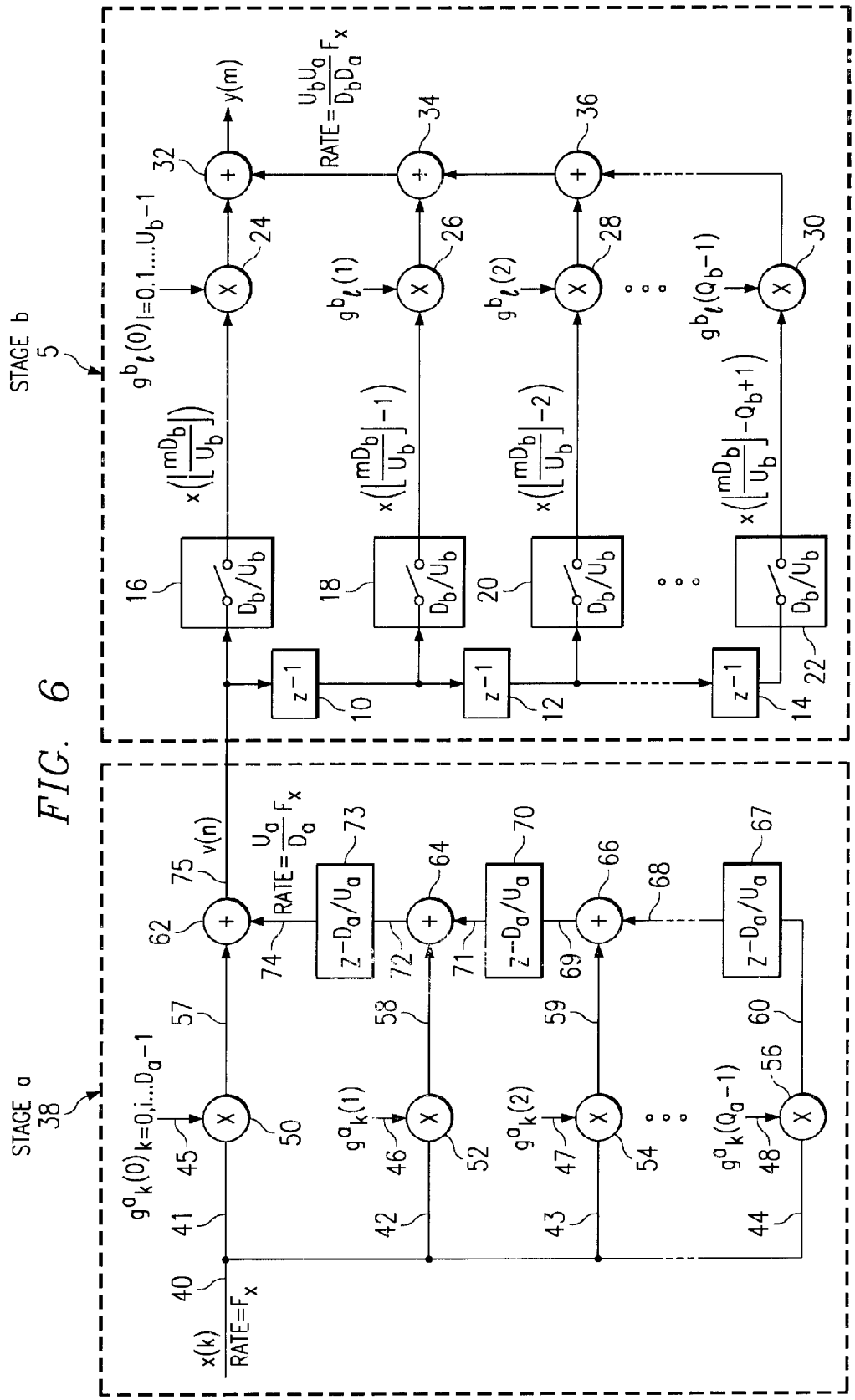
FIG. 6 is a block diagram of a multi-stage digital signal device having FIR structure with time-varying coefficient filtering in accordance with this invention.

FIG. 6 illustrates an example of a multistage embodiment of the invention which uses the sampling rate conversion apparatus of FIG. 3 coupled to the sampling rate conversion apparatus of FIG. 2 to realize a narrow-band FIR filter. For example, where a signal must be scaled by a ratio of 15/77, one stage may scale the signal by 3/7, followed by a second stage which scales the signal by 5/11. Since an FIR filter must have a cutoff frequency of π divided by the larger of the numerator or the denominator, this example would provide for a cutoff frequency of π/77 which requires a very narrow band filter. Accordingly, this type of filter would require a large number of coefficients. Multistage sampling provides a means to reduce the coefficient storage apparatus required in the filter. As an added feature, using this multistage embodiment, the same sampling clock may be used in both stages to control shift registers 67, 70, 73, 10, 12, and 14 or the stages may operate independent of one another.

Figure 7:
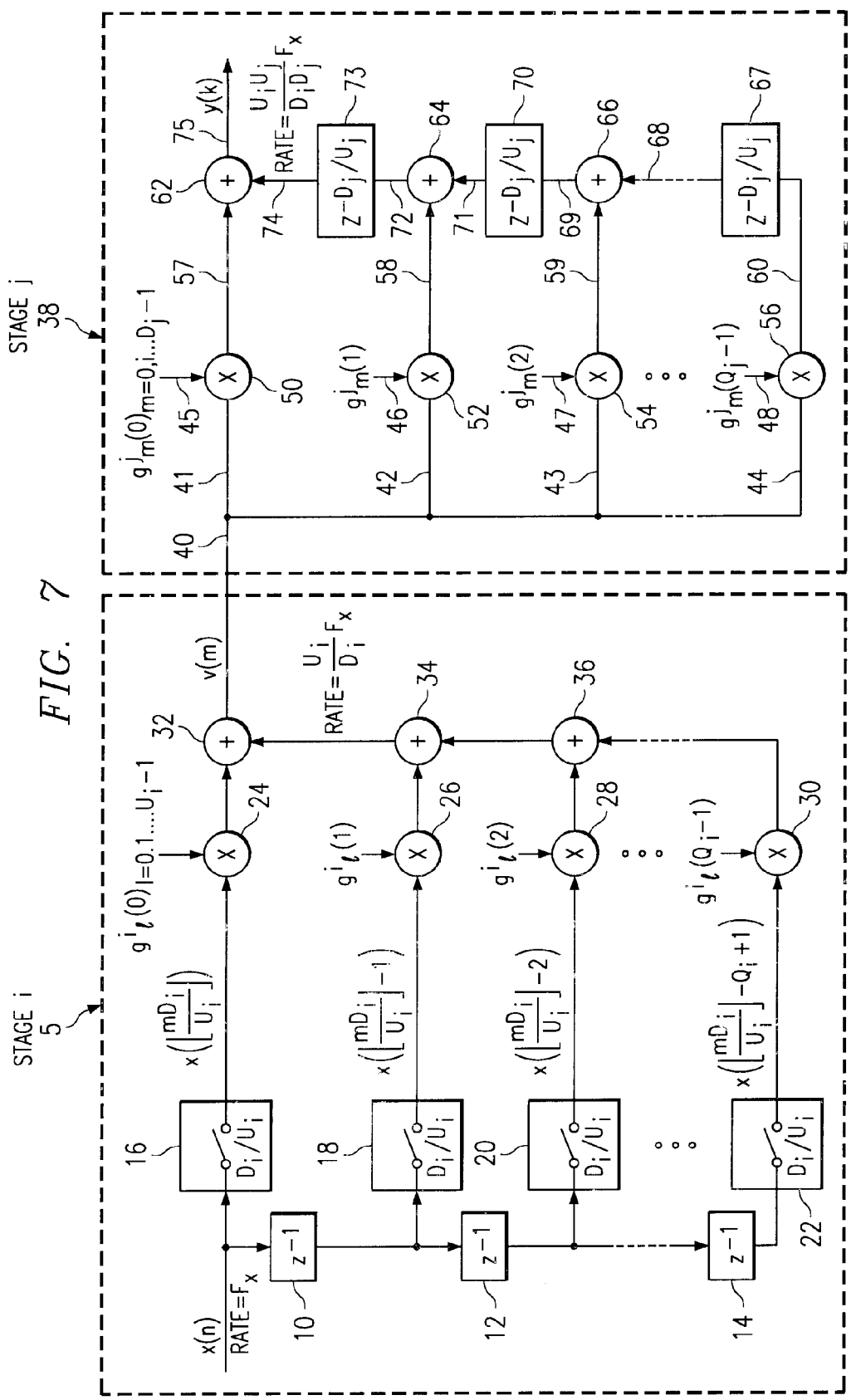
FIG. 7 is a block diagram of another embodiment of a multi-stage digital signal device having FIR structure with time-varying coefficient filtering in accordance with this invention.

In the like fashion, FIG. 7 illustrates an example of a multistage embodiment of the invention which uses the sampling rate conversion apparatus of FIG. 2 coupled to the sampling rate conversion apparatus of FIG. 3. Using both the prior art version of a sampling rate conversion apparatus in FIG. 2 coupled to our invention in FIG. 3, each multiplier 24, 26, 28, 30, 50, 52, 54, and 56 and adder 32, 34, 36, 62, 64, and 66 will operate at the same rate. In a digital signal processor (DSP), the DSP will be able to operate more efficiently if all computation is performed at the same rate. In addition, in a pipeline architecture implementation, bottlenecks in the pipeline are reduced if all computations are performed at the same rate.

Another multistage embodiment (not shown) of the present invention may include the coupling of n-stages of the sampling rate conversion apparatus of FIG. 3 in accordance with our invention together to realize a narrow-band FIR filter.

Further scope of applicability of the present invention should become apparent from the detailed description given above. However, it should be understood that the detailed description and specific examples, while indicating embodiments of the invention, are given by way of illustration only, since various changes and modifications within the spirit and scope of the invention should become apparent to those skilled in the art from this detailed description. Accordingly, this detailed description and specific examples are not to be considered as limiting the present invention.

I claim:

1. Apparatus for converting the sampling rate of a digital input signal from $f_x$ to $((U/D))f_x$, where U and D are integers, comprising
   A. an input lead, the digital input signal coupled to said input lead;
   B. multiplier means having an output and a first and second input terminals for supplying an output signal that is the product of the signals applied to said first and second input terminal, said input lead coupled to said second input terminal of said multiplier;
   C. coefficient storage means coupled to said first input of said multiplier means for storing D sets of coefficients, $g_{i \oplus D}(n)$, n=0, 1, . . . , (Q-1), each of said D sets of coefficients having q elements with the $j^{th}$ element, j=0, 1, . . . , (Q-1), equal to $g_{i \oplus D}(j)=h(jD+(-iU)$ modulo D), where the function h denotes the coefficients of a FIR filter having coefficients with unit sample response length N and input index i=−∞ . . . 0, 1, . . . ∞;
   D. sequence means coupled to said coefficient storage means for sequentially transferring and selecting each coefficient set $g_{i \oplus D}(n)$ coupled to said first input terminal of said multiplier;
   E. accumulation means coupled to the output of said multiplier means for determining the output partial sums by summing the products supplied by multiplier means; and
   F. output buffer storage means coupled to said accumulation means for storing the accumulated output sample y(n).

2. The sampling rate conversion apparatus of claim 1 wherein Q=N/D.

3. A method of transmitting first and second time discrete signals between source and sink systems wherein in first signal x(k) is generated by said source system at a first sampling rate $f_x$ and a second time discrete signal y(m) is generated by said sink system at a second sampling rate $f_y$ different from said first sampling rate $f_x$, where $f_y=U/Df_x$ [k is an integer 0, 1, . . . k and m=⌈kU/D⌉+n], comprising the steps of:
   A. multiplying said first time discrete signal x(k) by each of the $g_{i \oplus D}(n)$ coefficients, n=0, 1, . . . , (Q-1), each of said D sets of coefficients having q elements with the $j^{th}$ element, j=0, 1, . . . , (Q-1), equal to $g_{i \oplus D}(j)=h(jD+(-iU)$ modulo D), where the function h denotes the coefficients of a FIR filter having coefficients with unit sample response length N and input index i=−∞ . . . 0, 1, . . . ∞, where Q=⌈N/D⌉ and N=length of filter h();
   B. accumulating said multiplied signals in each of a Q plurality of matrix delay elements having time delay of $D/(Uf_x)$;
   C. shifting said Q plurality of delayed signals to generate said second time discrete signal y(m) having a sampling rate $f_y=U/Df_x$; and
   D. holding said summed signal y(m) in an output buffer.

4. Apparatus for converting the sampling rate of a digital input signal from $f_x$ to $((U/D))f_x$, where U and D are integers, comprising A. an input lead, the digital input signal coupled to said input lead;

B. a multiplier having an output and a first and second input terminals for supplying an output signal that is the product of the signals applied to said first and second input terminal, said input lead coupled to said second input terminal of said multiplier;

C. a memory unit coupled to said first input of said multiplier for storing D sets of coefficients, $g_{i\oplus D}(n)$, $n=0, 1, \ldots, (Q-1)$, each of said D sets of coefficients having q elements with the $j^{th}$ element, $j=0, 1, \ldots, (Q-1)$, equal to $g_{i\oplus D}(j)=h(jD+(-iU)$ modulo D), where the function h denotes the coefficients of a FIR filter having coefficients with unit sample response length N and input index $i=-\infty \ldots 0, 1, \ldots \infty$;

D. a sequencer coupled to said memory unit for sequentially transferring and selecting each coefficient set $g_{i\oplus D}(n)$ coupled to said first input terminal of said multiplier;

E. an adder coupled to the output of said multiplier for determining the output partial sums by summing the products supplied by said multiplier; and F. output buffer coupled to said adder for storing the accumulated output sample y(n).

5. A multistage apparatus having at least two stages for converting the sampling rate of a digital input signal from $f_x$, to $((U_aU_b/D_aD_b))f_x$, where $U_a$, $U_b$, $D_a$ and $D_b$ are integers, comprising a first stage; and a second stage coupled to said first stage, wherein the first stage comprises an input lead, the digital input signal coupled to said input lead;

a multiplier having an output and a first and second input terminals for supplying an output signal that is the product of the signals applied to said first and second input terminal, said input lead coupled to said second input terminal of said multiplier;

a memory unit coupled to said first input of said multiplier for storing $D_a$ sets of coefficients, $g^a_{i\oplus D}(n)$, $n=0, 1 \ldots, (Q_a-1)$, each of said $D_a$ sets of coefficients having $Q_a$ elements with the $j^{th}$ element, $j=0, 1, \ldots, (Q_a-1)$, equal to $g^a_{i\oplus D}(j)=h_a(jD_a+(-iU_a)$ modulo $D_a$) where the function ha denotes the coefficients of a FIR filter having coefficients with unit sample response length $N_a$ and input index $i=-\infty \ldots 0, 1, \ldots \infty$;

a sequencer coupled to said memory unit for sequentially transferring and selecting each coefficient set $g^a_{i\oplus D}(n)$ coupled to said first input terminal of said multiplier;

an adder coupled to the output of said multiplier for determining the output partial sums by summing the products supplied by said multiplier; and output buffer coupled to said adder for storing the accumulated output sample y(n); and wherein the second stage comprises a delay coupled to said first stage for supplying a delay to the accumulated output sample y(n);

a switch coupled to said delay;

a multiplier having an output and a first and second input terminals for supplying an output signal that is the product of the signals applied to said first and second input terminal, said first input terminal coupled to said switch;

a memory unit coupled to said second input of said multiplier for storing $D_b$ sets of coefficients, $g^b_{i\oplus U}(n)$, $n=0, 1, \ldots, (Q_b-1)$, each of said $D_b$ sets of coefficients having $Q_b$ elements with the $j^{th}$ element, $j=0, 1, \ldots, (Q_b-1)$, equal to $g^b_{i\oplus U}(j)=h_b(jU_b+(iD_b)$ modulo $U_b$), where the function $h_b$ denotes the coefficients of a FIR filter having coefficients with unit sample response length $N_b$ and input index $i=-\infty \ldots 0, 1, \ldots \infty$; and an adder coupled to the output of said multiplier for determining the output partial sums by summing the products supplied by said multiplier.

6. A multistage apparatus having at least two stages for converting the sampling rate of a digital input signal from $f_x$, to $((U_aU_b/D_aD_b))f_x$, where $U_a$, $U_b$, $D_a$ and $D_b$ are integers, comprising a first stage; and a second stage coupled to said first stage, wherein the first stage comprises a delay for supplying a delay to the output signal;

a switch coupled to said delay;

a multiplier having an output and a first and second input terminals for supplying an output signal that is the product of the signals applied to said first and second input terminal, said first input terminal coupled to said switch;

a memory unit coupled to said second input of said multiplier for storing $D_b$ sets of coefficients, $g^b_{i\oplus U}(n)$, $n=0, 1, \ldots, (Q_b-1)$, each of said $D_b$ sets of coefficients having $Q_b$ elements with the $j^{th}$ element, $j=0, 1, \ldots, (Q_b-1)$, equal to $g^b_{i\oplus U}(j)=h_b(jU_b+(iD_b)$ modulo $U_b$), where the function $h_b$ denotes the coefficients of a FIR filter having coefficients with unit sample response length $N_b$ and input index $i=-\infty \ldots 0, 1, \ldots \infty$; and an adder coupled to the output of said multiplier for determining the output partial sums by summing the products supplied by said multiplier; and wherein the second stage comprises an input lead, the digital input signal coupled to said first stage;

a multiplier having an output and a first and second input terminals for supplying an output signal that is the product of the signals applied to said first and second input terminal, said input lead coupled to said second input terminal of said multiplier;

a memory unit coupled to said first input of said multiplier for storing $D_a$ sets of coefficients, $g^a_{i\oplus D}(n)$, $n=0, 1, \ldots, (Q_a-1)$, each of said $D_a$ sets of coefficients having $Q_a$ elements with the $j^{th}$ element, $j=0, 1, \ldots, (Q_a-1)$, equal to $g^a_{i\oplus D}(j)=h_a(jD_a+(-iU_a)$ modulo $D_a$) where the function $h_a$ denotes the coefficients of a FIR filter having coefficients with unit sample response length $N_a$ and input index $i=-\infty \ldots 0, 1, \ldots \infty$;

a sequencer coupled to said memory unit for sequentially transferring and selecting each coefficient set $g^a_{i\oplus D}(n)$ coupled to said first input terminal of said multiplier;

an adder coupled to the output of said multiplier for determining the output partial sums by summing the products supplied by said multiplier; and output buffer coupled to said adder for storing the accumulated output sample y(n).

\* \* \* \* \*